(12) United States Patent
Jones

(10) Patent No.: US 6,557,161 B2
(45) Date of Patent: Apr. 29, 2003

(54) METHOD FOR PROTOTYPING ASYNCHRONOUS CIRCUITS USING SYNCHRONOUS DEVICES

(75) Inventor: Ian W. Jones, Palo Alto, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 21 days.

(21) Appl. No.: 09/895,924

(22) Filed: Jun. 28, 2001

(65) Prior Publication Data

US 2003/0005403 A1 Jan. 2, 2003

(51) Int. Cl.[7] .......................... G06F 17/50; G01R 13/28
(52) U.S. Cl. .................. 716/18; 716/4; 326/93
(58) Field of Search .................. 716/3–6, 16–18; 327/202, 203, 217, 218; 326/93–98

(56) References Cited

U.S. PATENT DOCUMENTS

| | | | | |
|---|---|---|---|---|
| 5,155,393 A | * | 10/1992 | Gongwer et al. | 327/218 |
| 5,410,194 A | * | 4/1995 | Freidin et al. | 327/218 |
| 5,650,938 A | * | 7/1997 | Bootehsaz et al. | 716/6 |
| 5,789,957 A | * | 8/1998 | Fucili et al. | 327/203 |
| 5,958,077 A | * | 9/1999 | Banerjee et al. | 714/738 |
| 6,088,821 A | * | 7/2000 | Moriguchi et al. | 714/724 |
| 6,434,722 B2 | * | 8/2002 | Kawarabayashi et al. | 716/3 |

OTHER PUBLICATIONS

"Synchronous Handshake Circuits" by Ad Peeters and Kees van Berkel from Philips Research Laboratories, Prof. Holstlaan 4 (WL01) 5656 AA Eindhoven, The Netherlands, as presented at Async 2001, Salt Lake City, Mar. 11–14, 2001, pp. 86–95.

* cited by examiner

Primary Examiner—Tuan T. Lam
Assistant Examiner—Terry L. Englund
(74) Attorney, Agent, or Firm—Edward J. Grundler; Park, Vaughan & Fleming LLP

(57) ABSTRACT

One embodiment of the present invention provides a system that facilitates prototyping asynchronous circuits. The system first receives a design of an asynchronous circuit, which includes asynchronous cells. The system maps the asynchronous cells of the asynchronous circuit onto clocked synchronous cells within a logic array or programmable logic array device such as standard-cell gate-arrays and field-programmable gate-arrays. The mapping delays the generation of the asynchronous clock events until the next clock event, thus preserving the full functionality of the asynchronous circuit. The system then implements the mapped circuit on the synchronous device to perform the functions that are mapped from the asynchronous circuit. Finally, the system operates the synchronous device, and the results of operating the synchronous device are used to verify the design of the asynchronous circuit.

16 Claims, 9 Drawing Sheets

METHOD FOR PROTOTYPING ASYNCHRONOUS CIRCUITS USING SYNCHRONOUS DEVICES

BACKGROUND

1. Field of the Invention

The present invention relates to prototyping electronic circuits. More particularly, the present invention relates to a method for prototyping asynchronous circuits using synchronous devices.

2. Related Art

Digital circuit designers use a wide variety of tools and techniques to prototype circuits so that the circuit design can be evaluated prior to committing the circuits to a custom integrated circuit device. Among the prototyping devices used by digital circuit designers are field-programmable gate-arrays and standard cell gate-array devices.

Both field-programmable gate-arrays and standard cell gate-array devices are optimized for prototyping synchronous, or clocked, digital circuits. A typical logic element of these devices is a master-slave D-type flip-flop, which is clocked by a globally distributed clock signal. In use, the digital circuit designer couples these logic elements together through primitive logic elements such as and-gates and or-gates to implement a desired circuit configuration. Manufacturers of these prototyping devices provide tools for the digital designer that simplify the task of mapping the designed circuit into the prototyping device. These tools assist the circuit designer in mapping a circuit configuration onto the prototype device. The tools also have internal processes, which aid in minimizing delays on interconnecting wiring and for checking for timing constraint violations.

There are, however, no equivalent devices and tools optimized for prototyping asynchronous, or unclocked, digital circuits. This leads designers of these asynchronous digital circuits to create a complete custom integrated circuit device, fabricate the device, and test the resulting device during the prototyping phase. The process of designing a custom integrated circuit device is a time-consuming manual process because of the lack of tools to aid this process. In addition, creating a custom integrated circuit device is a lengthy and expensive process leading to long delays for the designer trying to create a working asynchronous circuit.

In an attempt to overcome the drawbacks in prototyping asynchronous circuits, designers have attempted to map the circuits onto field-programmable gate-arrays using the available primitive logic elements to create the desired asynchronous circuit cells, such as set-reset (SR) flip-flops. Many asynchronous circuit cells rely on carefully managed delay constraints within the cells, while using more robust delay-tolerant or delay-insensitive communication techniques between the cells. Mapping such asynchronous cells onto standard cell gate-arrays and field-programmable gate-arrays has met with little success because the associated design tools expect the use of a clock signal that is not used in the asynchronous circuits. Furthermore, these design tools do not provide the designer with enough control over delays within the cell to ensure correct operation. These design tools often have sophisticated features that optimize logic between clocked storage elements, that because of the lack of the clock, asynchronous designs cannot take advantage of these features. When presented with an asynchronous design, these optimization tools usually make the circuit performance worse rather than better. Additionally, the resulting circuits do not use the resources of the field-programmable gate-array very efficiently because the primary storage elements available, such as master-slave D-type flip-flops that are normally operated by the globally distributed clock, cannot be used in the asynchronous cells.

Other techniques for prototyping asynchronous circuits using gate-arrays and/or field-programmable gate-arrays use completely different signaling protocols and circuit implementations in the clocked semi-custom gate-array technology than are used in the asynchronous full-custom design. The two designs are equivalent in function only and so an important feature of prototyping is lost, namely that the prototype circuit, built in some rapid turn-around technology, should resemble as much as possible the final circuit design to be implemented in full-custom technology.

What is needed is a method of mapping an asynchronous circuit design onto a field-programmable gate-array or a standard cell device, which eliminates the problems described above.

SUMMARY

One embodiment of the present invention provides a system that facilitates prototyping asynchronous circuits where only a minimum of modifications are made to the circuit. The system first receives a design of an asynchronous circuit, which includes asynchronous cells. The system maps the asynchronous cells of the asynchronous circuit onto clocked synchronous cells within a logic array or programmable logic array device such as standard-cell gate-arrays and field-programmable gate-arrays. The mapping delays the generation of all asynchronous control events until the next clock event, thus preserving the full functionality of the asynchronous circuit. The system then programs the programmable synchronous device to perform the functions that are mapped from the asynchronous circuit. Finally, the system operates the programmable synchronous device, and the results of operating the programmable synchronous device are used to verify the design of the asynchronous circuit.

In one embodiment of the present invention, the programmable synchronous device includes a field-programmable gate-array.

In one embodiment of the present invention, the synchronous cell is taken from a standard cell library. A standard cell library is typically available in all forms of clocked semi-custom and custom integrated circuit design methods.

In one embodiment of the present invention, the system maps an asynchronous cell to a synchronous cell by first mapping an SR flip-flop in a control path of the asynchronous cell to a clocked D-type master-slave flip-flop in the synchronous device. Next, the system maps a latch, a pass-gate, and a sticky-buffer combination in a data path of the asynchronous cell to another clocked D-type master-slave flip-flop in the synchronous device. The clocked D-type master-slave flip-flop in the control path indicates whether the clocked D-type master-slave flip-flop in the data path is empty or full, i.e., whether the data stored in the D-type master-slave flip-flop in the data path is non-valid or valid. The system maps a gated clock to the clocked D-type master-slave flip-flop in the control path. The system also maps a gated clock to the clocked D-type master-slave flip-flop in the data path.

In one embodiment of the present invention, the system passes the gated clock to the clocked D-type master-slave flip-flop in the control path when the clocked D-type master-slave flip-flop in the control path is set to empty and an input signal indicates that incoming data are valid, thereby changing the state of the clocked D-type master-slave flip-flop in the control path to full. The system also passes this gated clock to the clocked D-type master-slave flip-flop in the control path when the clocked D-type master-slave flip-flop in the control path is set to full and an input signal from the next synchronous cell indicates that a next synchronous cell is empty, thereby setting clocked D-type master-slave flip-flop in the control path to empty. The system passes the gated clock to the clocked D-type master-slave flip-flop in the data path when the clocked D-type master-slave flip-flop in the control path is set to empty and the input signal indicates that incoming data are valid, thereby latching the incoming data in the clocked D-type master-slave flip-flop in the data path.

In one embodiment of the present invention, the system maps an SR flip-flop in a control path of the asynchronous cell to a data recirculation flip-flop in the control path of the synchronous cell. The system also maps a latch, a pass-gate, and a sticky-buffer combination in a data path of the asynchronous cell to another data recirculation flip-flop in the data path of the synchronous cell. The state of the data recirculation flip-flop in the control path indicates whether the data recirculation flip-flop in the data path is empty or full. The system maps a recirculation control signal to the data recirculation flip-flop in the control path. The system also maps a recirculation control signal to the data recirculation flip-flop in the data path.

In one embodiment of the present invention, the system sets the recirculation control signal applied to the data recirculation flip-flop in the control path to change a state of this data recirculation flip-flop when the data recirculation flip-flop is set to empty and the input signal indicates that incoming data are valid. The system also sets the recirculation control signal applied to the data recirculation flip-flop in the control path to change the state of this data recirculation flip-flop when the data recirculation flip-flop is set to full and an input signal indicates that a next synchronous cell is empty. The system sets the recirculation control signal applied to the data recirculation flip-flop in the data path to allow the incoming data value to set the state of the data recirculation flip-flop in the data path when the data recirculation flip-flop in the control path is set to empty and the input signal indicates that incoming data are valid.

In one embodiment of the present invention, the system maps an SR flip-flop in a control path of the asynchronous cell to a data recirculation cell in the control path of the synchronous cell. In this embodiment, the data recirculation cell in the control path includes an additional clocked D-type master-slave flip-flop to extend the data recirculation control signal. The system maps a pass-gate and a sticky-buffer in a data path of the asynchronous cell to a data recirculation flip-flop in the data path of the synchronous cell. The data recirculation cell in the control path indicates whether the data recirculation flip-flop in the data path is empty or full. The system maps a recirculation control signal to the data recirculation cell in the control path. The system also maps a recirculation control signal to the data recirculation flip-flop in the data path.

In one embodiment of the present invention, the system sets the recirculation control signal applied to the data recirculation cell in the control path to change a state of this data recirculation cell when the data recirculation cell is set to empty and an input signal indicates that incoming data are valid. The system also sets this recirculation control signal to change the state of the data recirculation cell when the data recirculation cell is set to full and another input signal indicates that a next synchronous cell is empty. The system sets the recirculation control signal applied to the data recirculation flip-flop in the data path to allow the incoming data value to set the state of the data recirculation flip-flop.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

An Asynchronous FIFO Example Circuit

Figure 1:
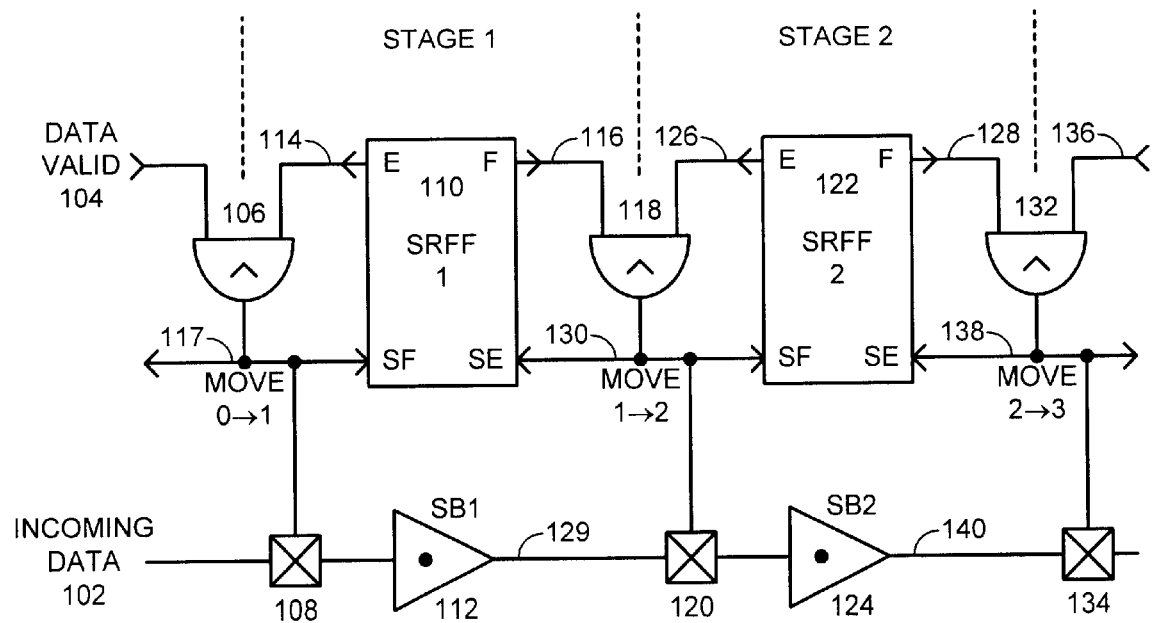
FIG. 1 illustrates an asynchronous circuit to be prototyped in accordance with an embodiment of the present invention.
Figure 1A:
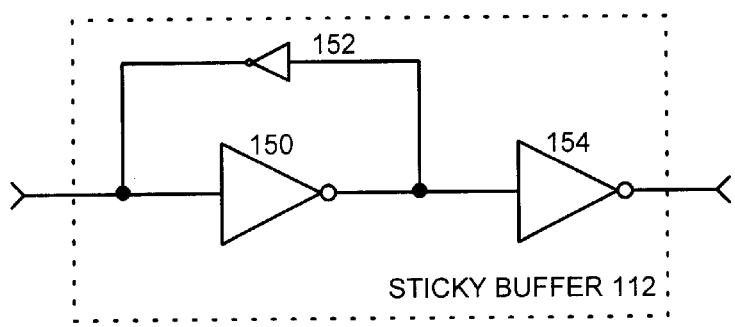
FIG. 1A illustrates sticky buffer 112 in accordance with an embodiment of the present invention.

FIG. 1 illustrates an asynchronous circuit to be prototyped in accordance with an embodiment of the present invention. This example asynchronous circuit implements a first-in, first-out (FIFO) data buffer. The asynchronous circuit includes two stages of pipelined asynchronous cells. SR flip-flops 110 and 122 are the control elements for stage one and stage two respectively. Normally-opaque pass-gates 108 and 120 control propagation of data into sticky-buffers 112 and 124 respectively, while normally-opaque pass-gate 134 controls propagation of data out of sticky-buffer 124. The combination of pass-gate 108 and sticky-buffer 112 forms a latch. A sticky buffer is a buffer circuit with weak feedback so that it has storage. FIG. 1A illustrates a typical sticky buffer 112 implementation. Inverters 150 and 154 form the normal path through the sticky buffer, while small inverter 152 provides weak feedback to inverter 150. And-gates 106, 118, and 132 provide move signals 117, 130, and 138 respectively, which move data through stage one and stage two. There is nothing inherent that limits this invention to a single data path associated with the control path or to only two stages. A person of ordinary skill in the art can readily add additional data paths and additional stages.

During initialization, the system applies a global reset signal (not shown) to SR flip-flops 110 and 122 setting flip-flops 110 and 122 to empty. In this state, empty signals 114 and 126 are set to true, while full signals 116 and 128 are set to false.

In operation the system applies incoming data 102 to normally-opaque pass-gate 108. Normally-opaque pass-gate 108 blocks incoming data 102 until move signal 117 is applied to normally-opaque pass-gate 108. Next, the system applies data valid 104 to and-gate 106. Incoming data 102 and data valid 104 are bundled such that data valid 104 is not applied until incoming data 102 is valid.

And-gate 106 sets move signal 117 to true in response to both data valid 104 and empty signal 114 from SR flip-flop 110 being true. Move signal 117 has three functions. First, move signal 117 causes normally-opaque pass-gate 108 to become transparent, thereby passing incoming data 102 to sticky-buffer 112. Second, move signal 117 causes SR flip-flop 110 to change state to full. Changing the state of SR flip-flop 110 to full causes empty signal 114 to go to false while full signal 116 goes to true. Additionally, move signal 117 is passed to the system to inform the system that incoming data 102 has been latched into sticky-buffer 112. And-gate 106 sets move signal 117 to false in response to empty signal 114 being set to false. Setting move signal 117 to false returns pass-gate 108 to its normally-opaque state. Sticky-buffer 112 now holds the state of incoming data 102 and SR flip-flop 110 indicates that sticky-buffer 112 is full. Normally-opaque pass-gate 120 prevents output 129 of sticky-buffer 112 from being applied to sticky-buffer 124 in stage two.

And-gate 118 sets move signal 130 to true in response to both full signal 116 from SR flip-flop 110 and empty signal 126 from SR flip-flop 122 being true. Move signal 130 has three functions. First, move signal 130 causes normally-opaque pass-gate 120 to become transparent, thereby passing output 129 from sticky-buffer 112 to sticky-buffer 124. Second, move signal 130 causes SR flip-flop 122 to change state to full. Changing the state of SR flip-flop 122 to full causes empty signal 126 to go to false while full signal 128 goes to true. Additionally, move signal 130 causes SR flip-flop 110 to change state to empty. And-gate 118 sets move signal 130 to false in response to empty signal 126 being set to false or full signal 116 being set to false. Setting move signal 130 to false returns pass-gate 120 to its normally-opaque state. Sticky-buffer 124 now holds the state of output 129 from sticky-buffer 112 and SR flip-flop 122 indicates that sticky-buffer 124 is full. SR flip-flop 110 sets empty signal 114 to true thereby enabling stage one to accept new data.

Full signal 128, empty signal 136, and-gate 132, move signal 138 and pass-gate 134 operate in a similar manner to move output 140 to an additional pipeline stage of the pipelined asynchronous circuit.

A Clocked Implementation of this Asynchronous FIFO Example Circuit

Figure 2:
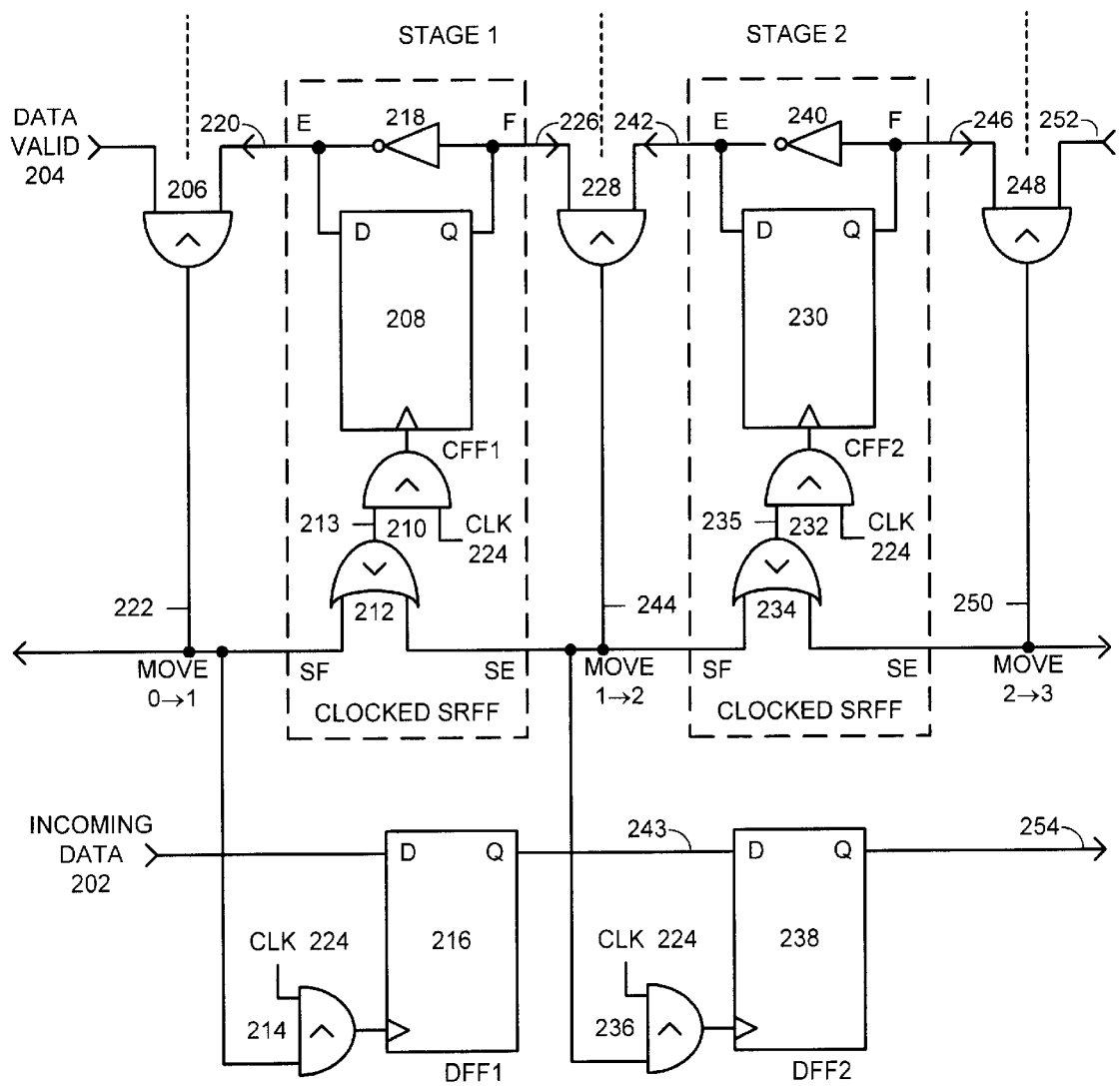
FIG. 2 illustrates an asynchronous circuit mapped to a synchronous circuit using gated clocks in accordance with an embodiment of the present invention.

FIG. 2 illustrates an asynchronous circuit mapped to a synchronous circuit using gated clocks in accordance with an embodiment of the present invention. In this embodiment, clocked D-type master-slave flip-flops 208 and 230 perform the control functions of SR flip-flops 110 and 122 from FIG. 1 respectively, while clocked D-type master-slave flip-flops 216 and 238 perform the functions of pass-gate 108 paired with sticky-buffer 112, and pass-gate 120 paired with sticky-buffer 124 respectively.

During initialization, the system applies a global reset signal (not shown) to clocked D-type master-slave flip-flops 208 and 230 to set full signals 226 and 246 respectively to false. The global reset signal may also be applied to clocked D-type master-slave flip-flops 216 and 238. Inverters 218 and 240 invert full signals 226 and 246 to create empty signals 220 and 242 respectively. At reset, empty signals 220 and 242 are both set to true.

In operation, the system applies incoming data 202 to the D input of clocked D-type master-slave flip-flop 216 in the data path. Next, the system applies data valid 204 to and-gate 206. Incoming data 202 and data valid 204 are bundled such that data valid 204 is not applied until incoming data 202 is valid.

And-gate 206 sets move signal 222 to true in response to both data valid 204 and empty signal 220 from inverter 218 being true. Move signal 222 has three functions. First, move signal 222 is applied to and-gate 214 to control the clock signal applied to clocked D-type master-slave flip-flop 216. Second, move signal 222 is applied to or-gate 212. Or-gate 212 sets signal 213 to true in response to move signal 222 being true. Signal 213 from or-gate 212 is, in turn, applied to and-gate 210 to control the clock signal applied to clocked D-type master-slave flip-flop 208. Additionally, move signal 222 is passed to the system to inform the system that incoming data 202 will be latched into clocked D-type master-slave flip-flop 216 on the next clock signal 224.

Upon application of the next clock signal 224, clocked D-type master-slave flip-flop 208 changes state to full and clocked D-type master-slave flip-flop 216 changes data signal 243 to reflect the state of incoming data 202. Changing the state of clocked D-type master-slave flip-flop 208 to full causes full signal 226 to go to true while inverter 218 causes empty signal 220 to go to false. And-gate 206 sets move signal 222 to false in response to empty signal 220 being set to false. Setting move signal 222 to false causes and-gates 214 and 210 to block clock signal 224, thereby preventing further changes to clocked D-type master-slave flip-flops 208 and 216. Clocked D-type master-slave flip-flop 216 now holds the state of incoming data 202 and clocked D-type master-slave flip-flop 208 indicates that clocked D-type master-slave flip-flop 216 is full. Data signal 243 from clocked D-type master-slave flip-flop 216 is applied to clocked D-type master-slave flip-flop 238 in stage two. Note that the operation of this circuit is almost identical to the operation of the circuit in FIG. 1 with the difference being that the state of the flip-flops does not change until the next clock signal in this embodiment. This allows the control to operate asynchronously but with the granularity of the global clock.

And-gate 228 causes move signal 244 to be set to true in response to full signal 226 from clocked D-type master-slave flip-flop 208 and empty signal 242 from inverter 240 being true. Move signal 244 has three functions. First, move signal 244 is applied to and-gate 236 to control the application of clock signal 224 to clocked D-type master-slave flip-flop 238. Second, move signal 244 is applied to or-gate 234, which sets signal 235 to true. Signal 235 controls the application of clock signal 224 to clocked D-type master-slave flip-flop 230 through and-gate 232. Additionally, move signal 244 is applied to or-gate 212, which sets signal 213 to true which, in turn, is applied to and-gate 210 to control clock signal 224 applied to clocked D-type master-slave flip-flop 208.

Upon application of the next clock signal 224, clocked D-type master-slave flip-flop 208 changes state to empty, clocked D-type master-slave flip-flop 230 changes state to full, and clocked D-type master-slave flip-flop 238 latches the state of data signal 243. Changing the state of clocked D-type master-slave flip-flop 208 to empty causes full signal 226 to be set to false. Inverter 218 sets empty signal 220 to true, which will allow new data to be entered into stage one. The state of clocked D-type master-slave flip-flop 230 changes the state of full signal 246 to true. Inverter 240 sets empty signal 242 to false in response to full signal 246 being set to true. And-gate 228 sets move signal 244 to false, thereby blocking clock signal 224 from reaching clocked D-type master-slave flip-flops 208, 230, and 238.

Empty signal 252, move signal 250, and signal 235 operate in a similar manner to move data 254 to the next pipelined stage in the synchronous circuit.

A Second Clocked Implementation of this Asynchronous FIFO Circuit

Figure 3:
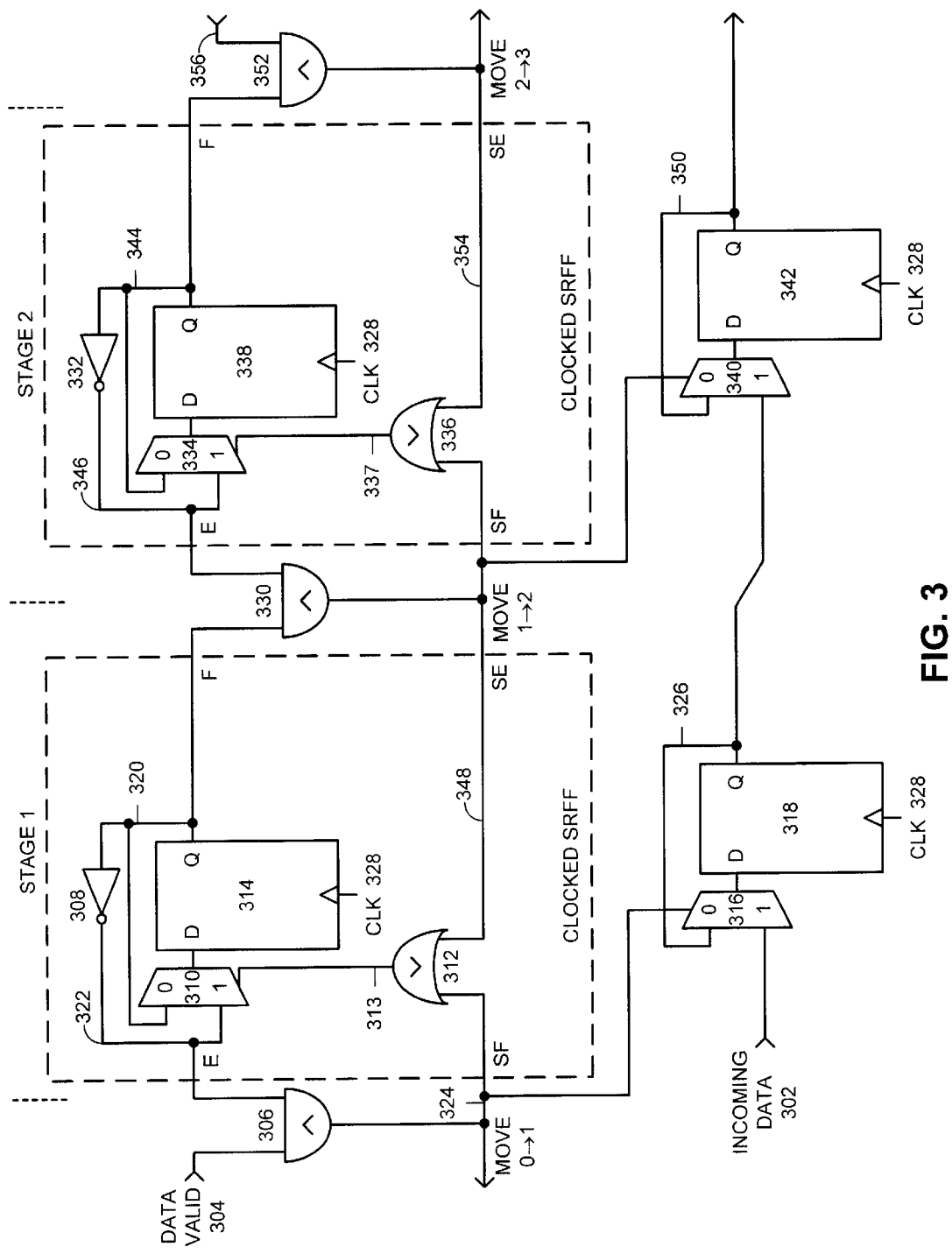
FIG. 3 illustrates an asynchronous circuit mapped to a synchronous circuit using data recirculation flip-flops in accordance with an embodiment of the present invention.

FIG. 3 illustrates an asynchronous circuit mapped to a synchronous circuit using data recirculation flip-flops in accordance with an embodiment of the present invention. In this embodiment, clocked D-type master-slave flip-flops 314 and 338 perform the control functions of SR flip-flops 110 and 122 from FIG. 1 respectively, while clocked D-type master-slave flip-flops 318 and 342 perform the functions of pass-gate 108 paired with sticky-buffer 112, and pass-gate 120 paired with sticky-buffer 124 respectively.

During initialization, the system applies a global reset signal (not shown) to clocked D-type master-slave flip-flops 314 and 338 to set full signals 320 and 344 respectively to false. The global reset signal may also be applied to clocked D-type master-slave flip-flops 318 and 342. Inverters 308 and 332 invert full signals 320 and 344 to create empty signals 322 and 346 respectively. At reset, empty signals 322 and 346 are both set to true. Prior to data valid 304 being applied, multiplexers 310, 316, 334, and 340 are set to recirculate the values stored in clocked D-type master-slave flip-flops 314, 318, 338, and 342 respectively in response to clock signal 328.

In operation, the system applies incoming data 302 to an input of multiplexer 316 in the data path. Next, the system applies data valid 304 to and-gate 306. Incoming data 302 and data valid 304 are bundled such that data valid 304 is not applied until incoming data 302 is valid.

And-gate 306 sets move signal 324 to true in response to both data valid 304 and empty signal 322 being true. Move signal 324 has three functions. First, move signal 324 is applied to multiplexer 316, which applies incoming data 302 to the D input of clocked D-type master-slave flip-flop 318. Second, move signal 324 is applied to or-gate 312. Or-gate 312 sets signal 313 to true in response to move signal 324. Signal 313 is applied to multiplexer 310, which applies empty signal 322 to the D input of clocked D-type master-slave flip-flop 314. Additionally, move signal 324 is sent to the system to inform the system that incoming data 302 will be latched in clocked D-type master-slave flip-flop 318 at the next clock signal 328.

Upon application of the next clock signal 328, clocked D-type master-slave flip-flop 314 changes state to full and clocked D-type master-slave flip-flop 318 changes data signal 326 to reflect incoming data 302. Changing the state of clocked D-type master-slave flip-flop 314 to full causes full signal 320 to go to true while inverter 308 causes empty signal 322 to go to false. And-gate 306 sets move signal 324 to false in response to empty signal 322 being set to false. Setting move signal 324 to false causes multiplexers 310 and 316 to select recirculation for clocked D-type master-slave flip-flops 314 and 318, thereby preventing further changes to clocked D-type master-slave flip-flops 314 and 318. Clocked D-type master-slave flip-flop 318 now holds the state of incoming data 302 and clocked D-type master-slave flip-flop 314 indicates that clocked D-type master-slave flip-flop 318 is full. Data signal 326 of clocked D-type master-slave flip-flop 318 is applied to multiplexer 340 in stage two. Note that the operation of this circuit is almost identical to the operation of the circuit in FIG. 1 with the difference being that the state of the flip-flops does not change until the next clock signal in this embodiment. This allows the control to operate asynchronously but with the granularity of the global clock.

And-gate 330 causes move signal 348 to be set to true in response to full signal 320 from clocked D-type master-slave flip-flop 314 and empty signal 346 from inverter 332 being true. Move signal 348 has three functions. First, move signal 348 is applied to multiplexer 340 to select data signal 326 to apply to the D input of clocked D-type master-slave flip-flop 342. Second, move signal 348 is applied to or-gate 336, which sets signal 337 to true in response. Control signal 337, in turn, is applied to multiplexer 334 to pass empty signal 346 to the D input of clocked D-type master-slave flip-flop 338. Additionally, move signal 348 is applied to or-gate 312. The output of or-gate 312, signal 313, is applied to multiplexer 310.

Upon application of the next clock signal 328, clocked D-type master-slave flip-flop 314 changes state to empty, clocked D-type master-slave flip-flop 338 changes state to full, and clocked D-type master-slave flip-flop 342 latches the state of data signal 326. Changing the state of clocked D-type master-slave flip-flop 314 to empty causes full signal 320 to be set to false. Inverter 308 sets empty signal 322 to true, which will allow new data to be entered into stage one. The state of clocked D-type master-slave flip-flop 338 changes the state of full signal 344 to true. Inverter 332 sets empty signal 346 to false in response to full signal 344 being set to true. And-gate 330 sets move signal 348 to false, thereby setting multiplexers 310, 334, and 340 to recirculate the values stored in clocked D-type master-slave flip-flops 314, 338, and 342.

Empty signal 356, move signal 354, and signal 337 operate in a similar manner to move data 350 to the next pipelined stage in the synchronous circuit.

A Third Clocked Implementation of this Asynchronous FIFO Circuit

Figure 4:
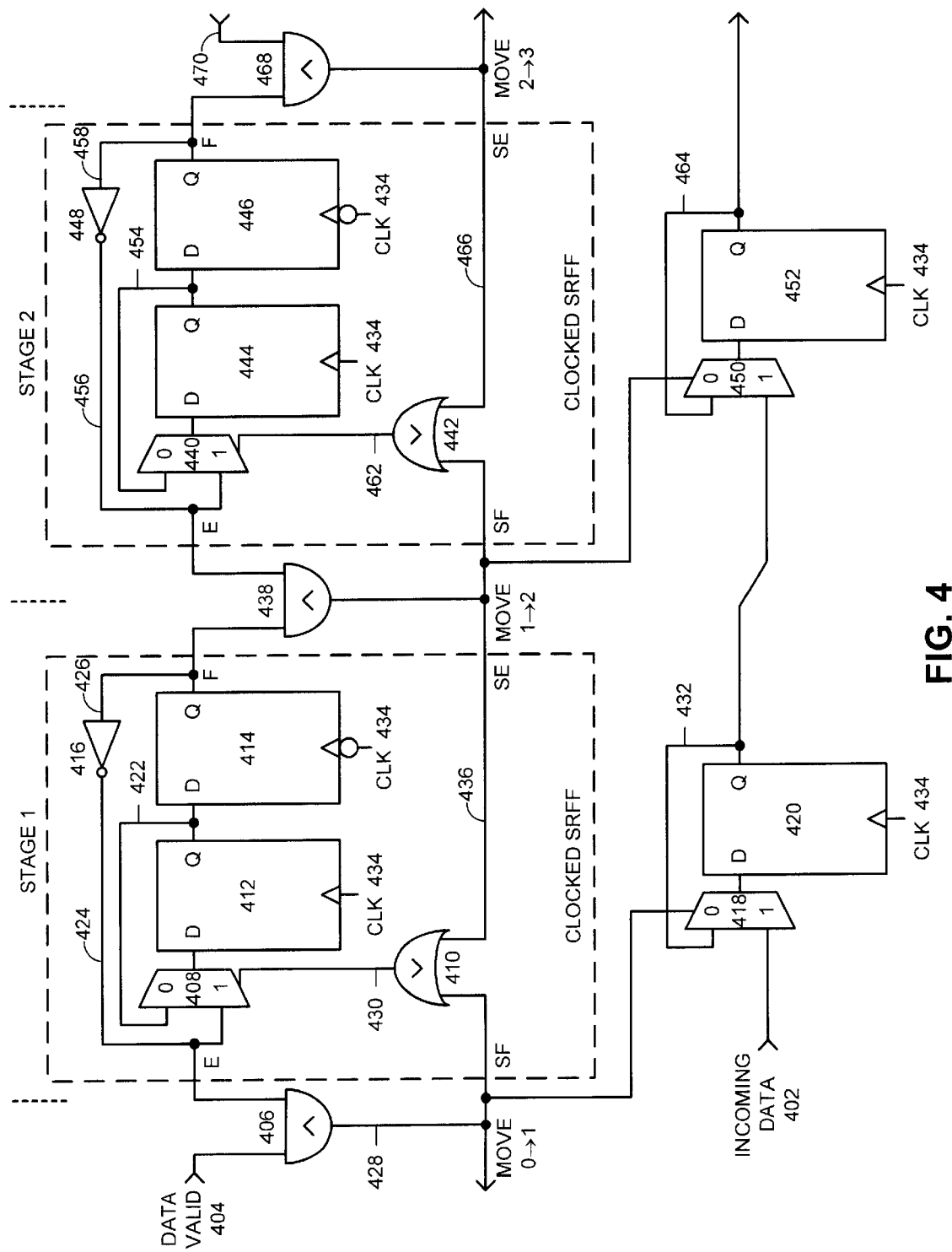
FIG. 4 illustrates an asynchronous circuit mapped to a synchronous circuit using data recirculation flip-flops with the control state change after the falling edge of the clock signal in accordance with an embodiment of the present invention.

FIG. 4 illustrates an asynchronous circuit mapped to a synchronous circuit using data recirculation flip-flops with the control state change after the falling edge of the clock signal in accordance with an embodiment of the present invention. In this embodiment, clocked D-type master-slave flip-flop pair 412 and 414 perform the control functions of SR flip-flop 110 while clocked D-type master-slave flip-flop pair 444 and 446 perform the control functions of SR flip-flop 122 from FIG. 1 respectively. Clocked D-type master-slave flip-flops 420 and 452 perform the functions of pass-gate 108 paired with sticky-buffer 112, and pass-gate 120 paired with sticky-buffer 124 respectively.

During initialization, the system applies a global reset signal (not shown) to clocked D-type master-slave flip-flops 412, 414, 444, and 446 to set full signal 422, delayed full signal 426, full signal 454 and delayed full signal 458 respectively to false. The global reset signal may also be applied to clocked D-type master-slave flip-flops 420 and 452. Inverters 416 and 448 invert delayed full signals 426 and 458 to create empty signals 424 and 456 respectively. At reset, empty signals 424 and 456 are both set to true. Prior to data valid 404 being applied, multiplexers 408, 418, 440, and 450 are set to recirculate the values stored in clocked D-type master-slave flip-flops 412, 420, 444, and 452 respectively in response to clock signal 434.

In operation, the system applies incoming data 402 to an input of multiplexer 418 in the data path. Next, the system applies data valid 404 to and-gate 406. Incoming data 402 and data valid 404 are bundled such that data valid 404 is not applied until incoming data 402 is valid.

And-gate 406 sets move signal 428 to true in response to both data valid 404 and empty signal 424 being true. Move signal 428 has three functions. First, move signal 428 is applied to multiplexer 418, which applies incoming data 402 to the D input of clocked D-type master-slave flip-flop 420. Second, move signal 428 is applied to or-gate 410. Or-gate 410 sets signal 430 to true in response to move signal 428. Signal 430 is applied to multiplexer 408, which applies empty signal 424 to the D input of clocked D-type master-slave flip-flop 412. Additionally, move signal 428 is sent to the system to inform the system that incoming data 402 will be latched in clocked D-type master-slave flip-flop 420 at the next clock signal 434.

Upon application of the next clock signal 434, clocked D-type master-slave flip-flop 412 changes state to full and clocked D-type master-slave flip-flop 420 changes data signal 432 to reflect incoming data 402. Changing the state of clocked D-type master-slave flip-flop 412 to full causes full signal 422 to go to true. The alternate edge of clock signal 434 changes the state of clocked D-type master-slave flip-flop 414 to match the state of clocked D-type master-slave flip-flop 412. This sets delayed full signal 426 to true. Inverter 416 causes empty signal 424 to go to false in response to delayed full signal 426. And-gate 406 sets move signal 428 to false in response to empty signal 424 being set to false. Setting move signal 428 to false causes multiplexers 408 and 418 to select recirculation for clocked D-type master-slave flip-flops 412 and 420, thereby preventing further changes to clocked D-type master-slave flip-flops 412 and 420. Clocked D-type master-slave flip-flop 420 now holds the state of incoming data 402 and clocked D-type master-slave flip-flop pair 412 and 414 indicate that clocked D-type master-slave flip-flop 420 is full. Data signal 432 of clocked D-type master-slave flip-flop 420 is applied to multiplexer 450 in stage two. Note that the operation of this circuit is almost identical to the operation of the circuit in FIG. 1 with the difference being that the state of the flip-flops does not change until the next clock pulse in this embodiment. Additionally, the circuit is not set to accept new data until the opposite edge of clock signal 434. This allows the control to operate asynchronously but with the granularity of the global clock while ensuring sufficient time for the data to be latched in clocked D-type master-slave flip-flop 420.

And-gate 438 causes move signal 436 to be set to true in response to delayed full signal 426 from clocked D-type master-slave flip-flop 414 and empty signal 456 from inverter 448 being true. Move signal 436 has three functions. First, move signal 436 is applied to multiplexer 450 to select data signal 432 to apply to the D input of clocked D-type master-slave flip-flop 452. Second, move signal 436 is applied to or-gate 442, which sets signal 462 to true in response. Control signal 462, in turn, is applied to multiplexer 440 to pass empty signal 456 to the D input of clocked D-type master-slave flip-flop 444. Additionally, move signal 436 is applied to or-gate 410. The output of or-gate 410, signal 430, is applied to multiplexer 408.

Upon application of the next clock signal 434, clocked D-type master-slave flip-flop 412 changes state to empty, clocked D-type master-slave flip-flop 444 changes state to full, and clocked D-type master-slave flip-flop 420 latches the state of data signal 402. On the alternate edge of clock signal 434, delayed clocked D-type master-slave flip-flops 414 and 446 change state to reflect the state of clocked D-type master-slave flip-flops 412 and 444 respectively. Changing the state of clocked D-type master-slave flip-flop 414 to empty causes delayed full signal 426 to be set to false. Inverter 416 sets empty signal 424 to true, which will allow new data to be entered into stage one. The state of clocked D-type master-slave flip-flop 446 changes the state of delayed full signal 458 to true. Inverter 448 sets empty signal 456 to false in response to delayed full signal 458 being set to true. And-gate 438 sets move signal 436 to false, thereby causing clocked D-type master-slave flip-flops 412, 444, and 452 to recirculate their current state.

Empty signal 470, move signal 466, and signal 462 operate in a similar manner to move data 464 to the next pipelined stage in the synchronous circuit. And-gate 468 combines empty signal 470 and delayed full signal 458 to generate move signal 466.

A Fourth Clocked Implementation of this Asynchronous FIFO Circuit

Figure 5:
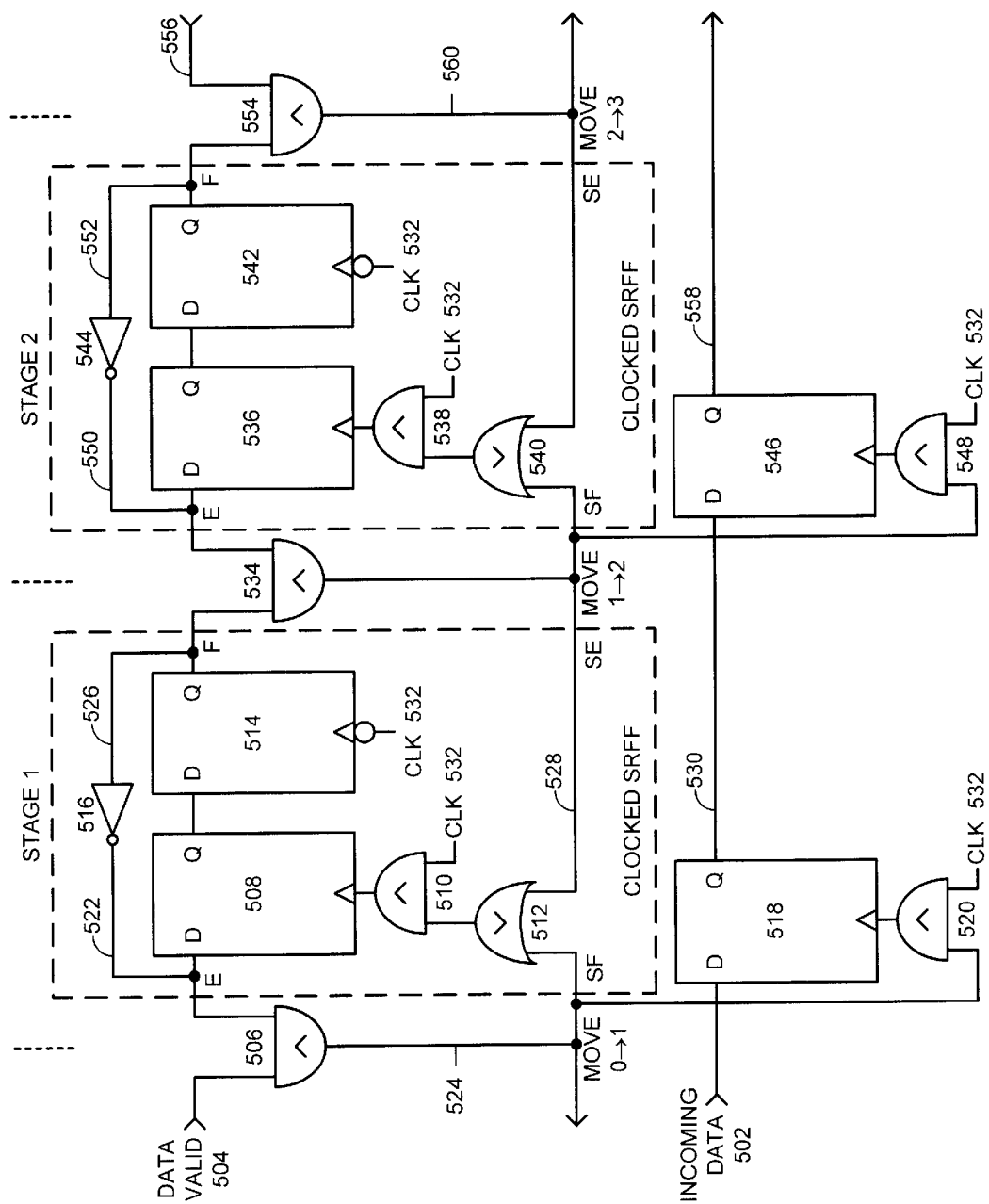
FIG. 5 illustrates an asynchronous circuit mapped to a synchronous circuit using gated clocks with the control state change after the falling edge of the gated clock signal in accordance with an embodiment of the present invention.

FIG. 5 illustrates an asynchronous circuit mapped to a synchronous circuit using gated clocks with the control state change after the falling edge of the gated clock signal in accordance with an embodiment of the present invention. In this embodiment, clocked D-type master-slave flip-flops 508 and 514 perform the control functions of SR flip-flop 110 and clocked D-type master-slave flip-flops 536 and 542 perform the control functions of SR flip-flop 122 from FIG. 1 respectively. Clocked D-type master-slave flip-flops 518 and 546 perform the functions of pass-gate 108 paired with sticky-buffer 112, and pass-gate 120 paired with sticky-buffer 124 of FIG. 1 respectively.

During initialization, the system applies a global reset signal (not shown) to clocked D-type master-slave flip-flops 508, 514, 536, and 542 to set full signals 526 and 552 respectively to false. The global reset signal may also be applied to clocked D-type master-slave flip-flops 518 and 546. Inverters 516 and 544 invert full signals 526 and 552 to create empty signals 522 and 550 respectively. At reset, empty signals 522 and 550 are both set to true.

In operation, the system applies incoming data 502 to the D input of clocked D-type master-slave flip-flop 518 in the data path. Next, the system applies data valid 504 to and-gate 506. Incoming data 502 and data valid 504 are bundled such that data valid 504 is not applied until incoming data 502 is valid.

And-gate 506 sets move signal 524 to true in response to both data valid 504 and empty signal 522 from inverter 516 being true. Move signal 524 has three functions. First, move signal 524 is applied to and-gate 520 to control clock signal 532 applied to clocked D-type master-slave flip-flop 518. Second, move signal 524 is applied to or-gate 512. The output from or-gate 512 is, in turn, applied to and-gate 510 to control clock signal 532 applied to clocked D-type master-slave flip-flop 508. Additionally, move signal 524 is passed to the system to inform the system that incoming data 502 will be latched into clocked D-type master-slave flip-flop 518 on the next clock signal 532.

Upon application of the next clock signal 532, clocked D-type master-slave flip-flop 508 changes state to full and clocked D-type master-slave flip-flop 518 changes data signal 530 to reflect incoming data 502. Clocked D-type master-slave flip-flop 514 changes state to full on the opposite edge of clock signal 532, thereby providing a delay in removing empty signal 522 from and-gate 506. Changing the state of clocked D-type master-slave flip-flop 514 to full causes full signal 526 to go to true while inverter 516 causes empty signal 522 to go to false. And-gate 506 sets move signal 524 to false in response to empty signal 522 being set to false. Setting move signal 524 to false causes and-gates 520 and 510 to block clock signal 532, thereby preventing further changes to clocked D-type master-slave flip-flops 508, 514, and 518. Clocked D-type master-slave flip-flop 518 now holds the state of incoming data 502 and clocked D-type master-slave flip-flops 508 and 514 indicates that clocked D-type master-slave flip-flop 518 is full. Data signal 530 of clocked D-type master-slave flip-flop 518 is applied to clocked D-type master-slave flip-flop 546 in stage two. Note that the operation of this circuit is almost identical to the operation of the circuit in FIG. 1 with the difference being that the state of the flip-flops does not change until the next clock pulse in this embodiment. This allows the control to operate asynchronously but with the granularity of the global clock.

And-gate 534 causes move signal 528 to be set to true in response to full signal 526 from clocked D-type master-slave flip-flop 514 and empty signal 550 from inverter 544 being set to true. Move signal 528 has three functions. First, move signal 528 is applied to and-gate 548 to control the application of clock signal 532 to clocked D-type master-slave flip-flop 546. Second, move signal 528 is applied to or-gate 540. The output of or-gate 540 is applied to and-gate 538, which controls the application of clock signal 532 to clocked D-type master-slave flip-flop 536. Additionally, move signal 528 is applied to or-gate 512 and, in turn, is applied to and-gate 510 to control clock signal 532 applied to clocked D-type master-slave flip-flop 508.

Upon application of the next clock signal 532, clocked D-type master-slave flip-flop 508 changes state to empty, clocked D-type master-slave flip-flop 536 changes state to full, and clocked D-type master-slave flip-flop 546 latches the state of data signal 530. Clocked D-type master-slave flip-flops 514 and 542 change state to reflect the state of clocked D-type master-slave flip-flops 508 and 536 respectively on the opposite edge of clock signal 532. Changing the state of clocked D-type master-slave flip-flop 514 to empty causes full signal 526 to be set to false. Inverter 516 sets empty signal 522 to true, which will allow new data to be entered into stage one. The state of clocked D-type master-slave flip-flop 542 changes the state of full signal 552 to true. Inverter 544 sets empty signal 550 to false in response to full signal 552 being set to true. And-gate 534 sets move signal 528 to false, thereby blocking clock signal 532 from reaching clocked D-type master-slave flip-flops 508, 536, and 546.

Empty signal 556 and move signal 560 operate in a similar manner to move data 558 to the next pipelined stage in the synchronous circuit. And-gate 554 combines empty signal 556 and full signal 552 to generate move signal 560.

A Synchronous Circuit Using Gated-Inverted Clock Signals

Figure 6:
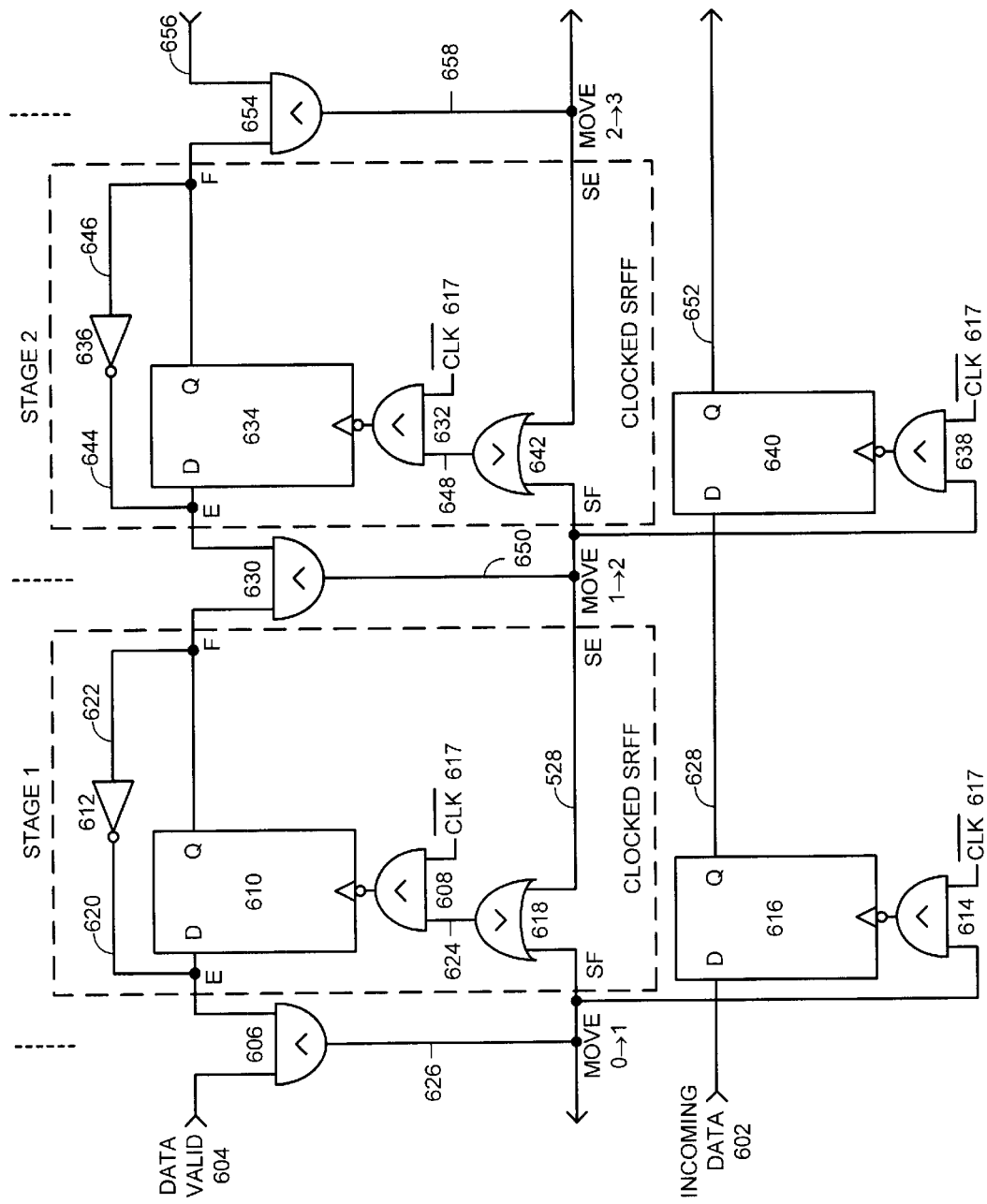
FIG. 6 illustrates an asynchronous circuit mapped to a synchronous circuit using gated-inverted clocks in accordance with an embodiment of the present invention.

FIG. 6 illustrates an asynchronous circuit mapped to a synchronous circuit using gated-inverted clocks in accordance with an embodiment of the present invention. The use of inverted clocks and nand-gates in this embodiment eases timing constraints on the gating signals applied to the clock gate circuits. In this embodiment, clocked D-type master-slave flip-flops 610 and 634 perform the control functions of SR flip-flops 110 and 122 from FIG. 1 respectively, while clocked D-type master-slave flip-flops 616 and 640 perform the functions of pass-gate 108 paired with sticky-buffer 112, and pass-gate 120 paired with sticky-buffer 124 respectively.

During initialization, the system applies a global reset signal (not shown) to clocked D-type master-slave flip-flops 610 and 634 to set full signals 622 and 646 respectively to false. The global reset signal may also be applied to clocked D-type master-slave flip-flops 616 and 640. Inverters 612 and 636 invert full signals 622 and 646 to create empty signals 620 and 644 respectively. At reset, empty signals 620 and 644 are both set to true.

In operation, the system applies incoming data 602 to the D input of clocked D-type master-slave flip-flop 616 in the data path. Next, the system applies data valid 604 to and-gate 606. Incoming data 602 and data valid 604 are bundled such that data valid 604 is not applied until incoming data 602 is valid.

And-gate 606 sets move signal 626 to true in response to both data valid 604 and empty signal 620 from inverter 612 being true. Move signal 626 has three functions. First, move signal 626 is applied to nand-gate 614 to control clock signal 617 applied to clocked D-type master-slave flip-flop 616. Second, move signal 626 is applied to or-gate 618. Signal 624 from or-gate 618 is, in turn, applied to nand-gate 608 to control clock signal 617 applied to clocked D-type master-slave flip-flop 610. Additionally, move signal 626 is passed to the system to inform the system that incoming data 602 will be latched into clocked D-type master-slave flip-flop 616 on the next clock signal 617.

Upon application of the next clock signal 617, clocked D-type master-slave flip-flop 610 changes state to full and clocked D-type master-slave flip-flop 616 changes data signal 628 to reflect incoming data 602. Changing the state of clocked D-type master-slave flip-flop 610 to full causes full signal 622 to go to true while inverter 612 causes empty signal 620 to go to false. And-gate 606 sets move signal 626 to false in response to empty signal 620 being set to false. Setting move signal 626 to false causes nand-gates 614 and 608 to block clock signal 617, thereby preventing further changes to clocked D-type master-slave flip-flops 610 and 616. Clocked D-type master-slave flip-flop 616 now holds the state of incoming data 602 and clocked D-type master-slave flip-flop 610 indicates that clocked D-type master-slave flip-flop 616 is full. Data signal 628 of clocked D-type master-slave flip-flop 616 is applied to clocked D-type master-slave flip-flop 640 in stage two. Note that the operation of this circuit is almost identical to the operation of the circuit in FIG. 1 with the difference being that the state of the flip-flops does not change until the next clock pulse in this embodiment. This allows the control to operate asynchronously but with the granularity of the global clock.

And-gate 630 causes move signal 650 to be set to true in response to full signal 622 from clocked D-type master-slave flip-flop 610 and empty signal 644 from inverter 636 being true. Move signal 650 has three functions. First, move signal 650 is applied to nand-gate 638 to control the application of clock signal 617 to clocked D-type master-slave flip-flop 640. Second, move signal 650 is applied to or-gate 642 to create signal 648. Signal 648 controls the application of clock signal 617 through and-gate 632 to clocked D-type master-slave flip-flop 634. Additionally, move signal 650 is applied to or-gate 618 to create signal 624 which, in turn, is applied to nand-gate 608 to control clock signal 61 7 applied to clocked D-type master-slave flip-flop 610.

Upon application of the next clock signal 617, clocked D-type master-slave flip-flop 610 changes state to empty, clocked D-type master-slave flip-flop 634 changes state to full, and clocked D-type master-slave flip-flop 640 latches the state of data signal 628. Changing the state of clocked D-type master-slave flip-flop 610 to empty causes full signal 622 to be set to false. Inverter 612 sets empty signal 620 to true, which will allow new data to be entered into stage one. The state of clocked D-type master-slave flip-flop 634 changes the state of full signal 646 to true. Inverter 636 sets empty signal 644 to false in response to full signal 646 being set to true. And-gate 630 sets move signal 650 to false, thereby blocking clock signal 617 from reaching clocked D-type master-slave flip-flops 610, 634, and 640.

Empty signal 656, move signal 658, and signal 648 operate in a similar manner to move data 652 to the next pipelined stage in the synchronous circuit. And-gate 654 combines empty signal 656 and full signal 646 to generate move signal 658.

Alternate Clocked SR Flip-Flop

Figure 6A:
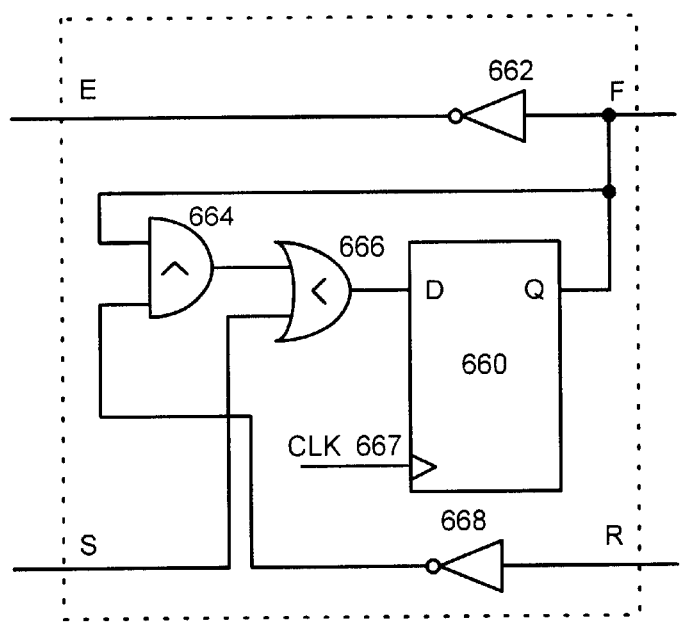
FIG. 6A illustrates an alternate implementation of a clocked SR flip-flop in accordance with an embodiment of the present invention.

FIG. 6A illustrates an alternate implementation of a clocked SR flip-flop in accordance with an embodiment of the present invention. In this implementation, the Q output of D-type master-slave flip-flop 660 indicates the state of the clocked SR flip-flop. When the Q output is low, D-type master-slave flip-flop 660 is indicating empty. When the Q output is high, D-type master-slave flip-flop 660 is indicating full.

Inverter 662 inverts the state of the full signal to create the empty signal. Clk 667 causes the Q output of D-type master-slave flip-flop 660 to change state to the state being applied to the D input of D-type master-slave flip-flop 660. The output of or-gate 666 is applied to the D input of D-type master-slave flip-flop 660. Or-gate 666 receives the S input for the clocked SR flip-flop and the output of and-gate 664. If either input to or-gate 666 is high, the D input to D-type master-slave flip-flop 660 is high. If both inputs to or-gate 666 are low, the D input to D-type master-slave flip-flop 660 is low.

And-gate 664 receives the Q output of D-type master-slave flip-flop 660 and the output of inverter 668. If both inputs to and-gate 664 are high, the output of and-gate 664 is high, otherwise, the output of and-gate 664 is low. Inverter 668 receives the R input of the SR flip-flop. Thus if the S input is high, then the Q output of D-type master-slave flip-flop 660 will go high after the next clock signal. While if the R input is high and the S input is low, then the Q output of D-type master-slave flip-flop 660 will go low after the next clock signal. Note that other implementations of the clocked SR flip-flop are possible.

A GasP Asynchronous Control Circuit

Figure 7A:
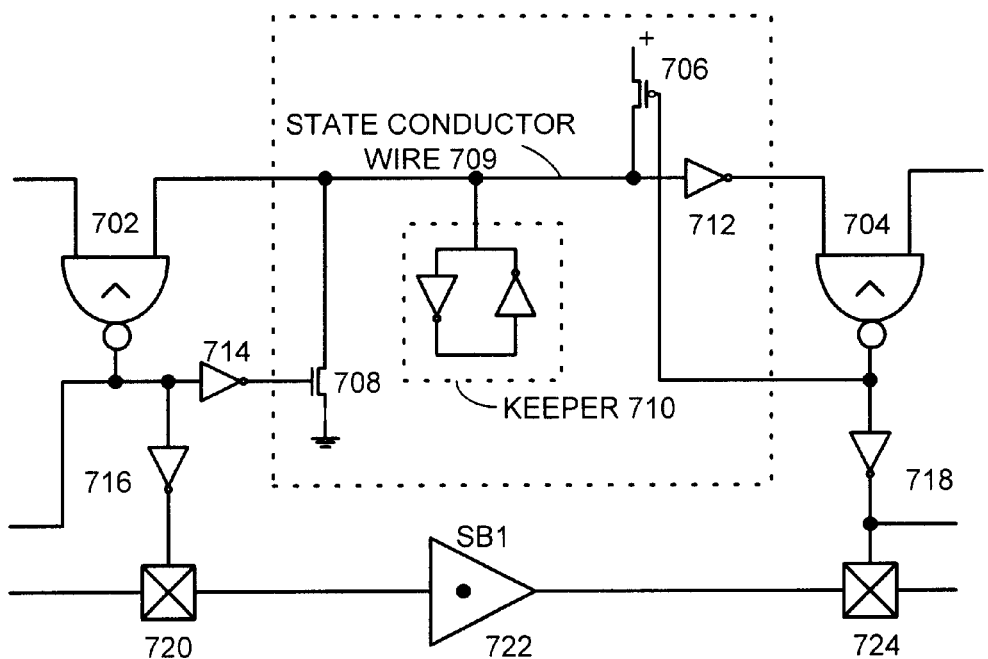
FIG. 7A illustrates a GasP asynchronous control circuit to be prototyped in accordance with an embodiment of the present invention.

FIG. 7A illustrates a GasP asynchronous control circuit to be prototyped in accordance with an embodiment of the present invention. In this implementation of a GasP asynchronous control circuit, keeper 710 holds state conductor wire 709 to indicate the state of sticky-buffer 722. Keeper 710 is implemented as two small inverters coupled back-to-back. The size of the two small inverters is such that keeper 710 can maintain the state of state conductor wire 709, but cannot prevent the state from being changed by gates 706 and 708. State conductor wire 709 is low when sticky-buffer 722 is full and high when sticky-buffer 722 is empty.

Nand-gate 702 receives the state of state conductor wire 709 and the data available from the preceding stage as inputs. When both inputs of nand-gate 702 are high, the output of nand-gate 702 goes low. This low is applied to inverters 714 and 716. The high output of inverter 716 is applied to normally-opaque pass-gate 720 allowing sticky-buffer 722 to change to the state of the input data. The high output of inverter 714 is applied to gate 708 which drains the charge on state conductor wire 709 causing state conductor wire 709 to go low indicating that sticky-buffer 722 has data, and that this stage is full.

Nand-gate 704 receives the output of inverter 712. A high output from inverter 712 indicates sticky-buffer 722 is full. Nand-gate 704 also receives the empty signal from the next stage. When both inputs to nand-gate 704 are high, the output of nand-gate 704 goes low. The output of nand-gate 704 is applied to inverter 718. The high output from inverter 718 is applied to normally-opaque pass-gate 724 to allow the state of sticky-buffer 722 to be passed to the next stage. The output of nand-gate 704 is also applied to pmos gate 706. Gate 706 applies charge to state conductor wire 709 making its state high to indicate that sticky-buffer 722 is empty.

A Clocked Version of a GasP Control Circuit

Figure 7B:
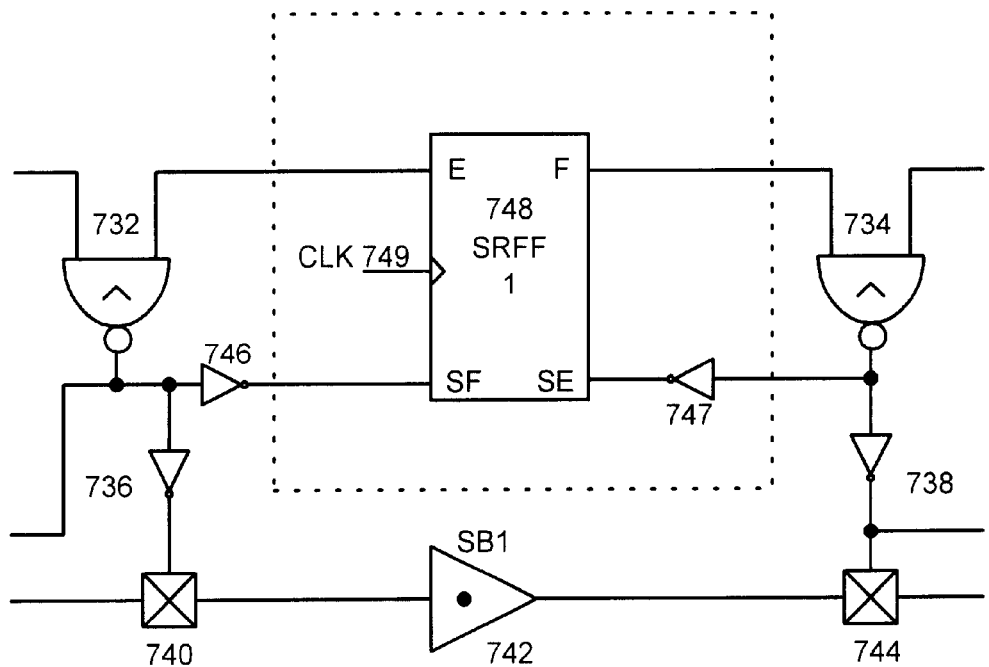
FIG. 7B illustrates a clocked version of a GasP asynchronous control circuit in accordance with an embodiment of the present invention.

FIG. 7B illustrates a clocked version of a GasP asynchronous control circuit in accordance with an embodiment of the present invention. In this implementation, nand-gates 732 and 734, inverters 746, 736, and 738, normally-opaque pass-gates 740 and 744, and sticky buffer 742 perform the same functions as nand-gates 702 and 704, inverters 714, 716, and 718, normally-opaque pass-gates 720 and 724, and sticky buffer 722 and will not be described further.

In this implementation, state is saved in clocked SR flip-flop 748. Clocked SR flip-flop responds to clk 749 and sets the state to empty or full depending on the inputs applied to SE and SF respectively. Inverter 747 inverts the output of nand-gate 734 to supply the correct logic signal to clocked SR flip-flop 748.

Design Verification Process

Figure 8:
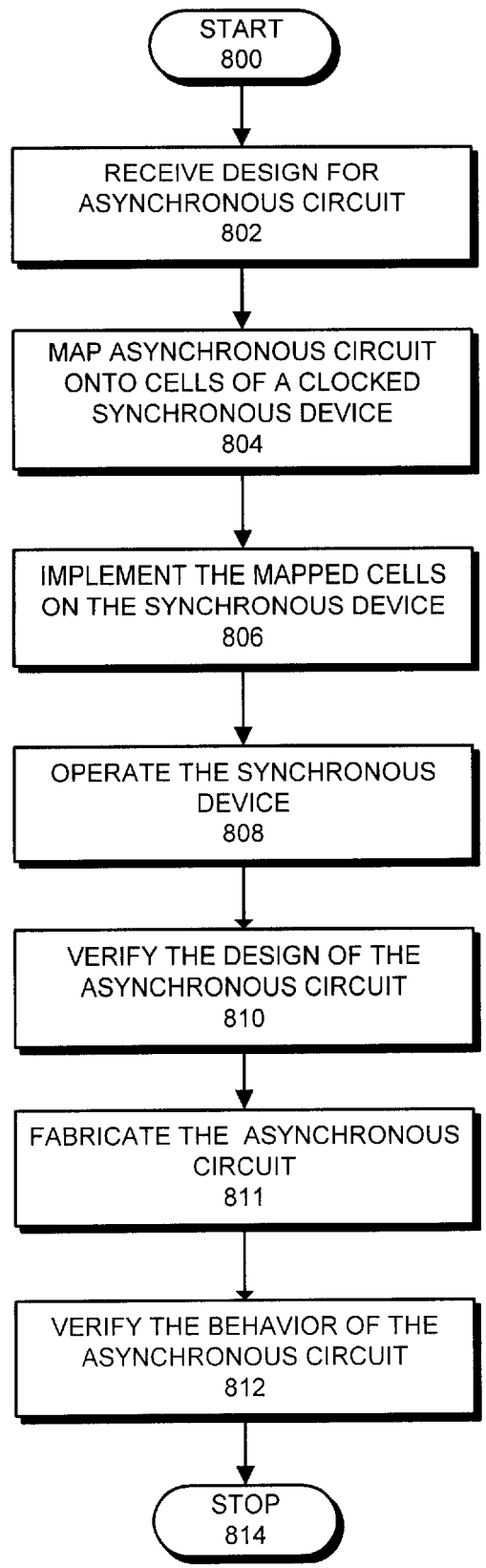
FIG. 8 is a flowchart illustrating the process of mapping an asynchronous circuit to a clocked synchronous device to verify the design of the asynchronous circuit in accordance with an embodiment of the present invention.

FIG. 8 is a flowchart illustrating the process of mapping an asynchronous circuit to a clocked synchronous device to verify the design of the asynchronous circuit in accordance with an embodiment of the present invention. The system starts when a design is received for an asynchronous circuit (step 802). Next, the system maps the asynchronous circuit onto cells of a clocked synchronous device (step 804).

After the asynchronous circuit is mapped onto the synchronous device, the synchronous device is implemented on the mapped circuit (step 806). The system then operates the synchronous device to simulate the operation of the asynchronous circuit (step 808). Next, the results of operating the synchronous device are used to verify the design of the asynchronous circuit (step 810). After verifying the design of the asynchronous circuit, the asynchronous circuit is fabricated (step 811). Finally, the behavior of the mapped asynchronous circuit is verified (step 812).

Clocked Asynchronous Circuits Facilitates Testing

Clocked asynchronous circuits can be functionally tested using a conventional clocked chip tester in the same manner as all other clocked circuit designs. With the gated clock versions of clocked asynchronous circuits, such as the mapping shown in FIG. 2, the circuit can be operated either fully clocked as described earlier or, if the clock signal is held high, then the circuit will operate fully asynchronously. Thus a conventional clocked chip tester can be used to verify correct functional behavior of this circuit when operated in its fully clocked mode. This facilitates greatly the testing of the circuit design. Further testing of the circuit design when operating fully asynchronously is still required, but using a conventional tester to carry out the bulk of the functional testing greatly simplifies the testing task. Thus there is an advantage to incorporating gated clocks into the final asynchronous design in step 810 of FIG. 8 because this facilitates the use of conventional chip testing techniques and methods in step 812 of FIG. 8. For example, the D-type master slave flip-flops in FIG. 2 can incorporate a small amount of extra circuit components that will enable their state to be scanned out serially to pins on the chip as is common practice in conventional clocked circuit designs. This makes the state of the flip-flops available to the tester thus enabling greater verification of the functional behavior of the design.

Delaying The Asynchronous Events

Figure 9:
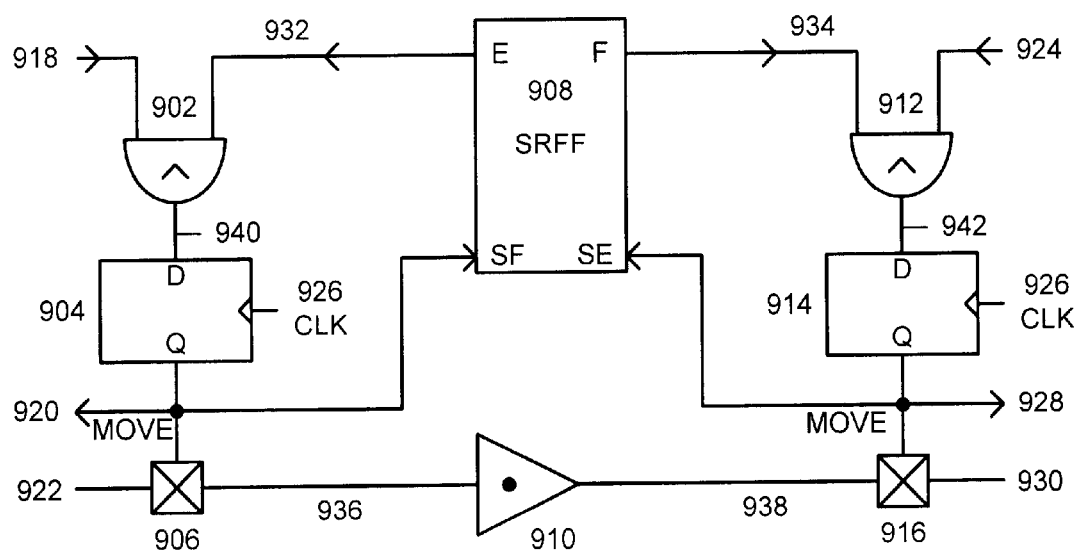
FIG. 9 illustrates adding D-type flip-flops to delay move events in accordance with an embodiment of the present invention.

FIG. 9 illustrates adding D-type flip-flops to delay move events in accordance with an embodiment of the present invention. Adding clocked D-type flip-flops is another way to facilitate functional testing of asynchronous circuit designs by delaying the move events of FIG. 1. The circuit in FIG. 9 operates much like the circuit in FIG. 1. When SR flip-flop 908 is set to empty, empty signal 932 is set to high and applied to and-gate 902. Data valid signal 918 is also applied to and-gate 902 from a previous stage or a signal source. In response to both signals being set to high, signal 940 is set to high. Signal 940 is applied to the D input of D-type flip-flop 904. The state of signal 940 is passed to the Q output of D-type flip-flop 904 on the next clock signal 926. The Q output of D-type flip-flop 904 is move signal 920.

When move signal 920 is set to high, SR flip-flop 908 is set which sets the empty signal 932 low and the full signal 934 to high. Signal 940 also goes low in response to empty signal 932 going low. Move signal 920 is also applied to normally-opaque pass-gate 906. When move signal 920 is high, normally-opaque pass gate 906 allows incoming data.920-to pass as signal 936 to sticky-buffer 910. Sticky-buffer 910 retains the state of incoming data 922 after move signal 920 goes low. Move signal 920 goes low after the next clock signal 926.

Full signal 934 and empty signal 924 from the next stage are applied to and-gate 912. Signal 942 goes high in response to both full signal 934 and empty signal 924 being high. On the next clock signal 926, D-type flip-flop 914 sets its Q output high causing move signal 928 to be high. Move signal 928 is coupled to normally-opaque pass gate 916, which sets outgoing data 930 to reflect the signal stored in sticky-buffer 910, which is transferred as signal 938. Move signal 928 is also applied to the SE input of SR flip-flop 908, which resets the flip-flop causing empty signal 932 to go high and full signal 934 to go low. Signal 942 goes low in response to full signal 934 going low. On the next clock signal 926, move signal 928 is set to low.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for prototyping an asynchronous circuit, comprising:

receiving a design of the asynchronous circuit, the design including asynchronous cells;

mapping an asynchronous cell of the asynchronous circuit onto a synchronous cell within a clocked synchronous device thereby creating a mapped circuit, wherein the synchronous cell simulates an operation of the asynchronous cell and wherein mapping the asynchronous cell involves:

mapping an SR flip-flop in a control path of the asynchronous cell to a first clocked D-type master-slave flip-flop in the synchronous cell, mapping a pass-gate and a sticky-buffer in a data path of the asynchronous cell to a second clocked D-type master-slave flip-flop in the synchronous cell, wherein the first clocked D-type master-slave flip-flop indicates that the second clocked D-type master-slave flip-flop is one of empty and full, mapping a first gated clock to the first clocked D-type master-slave flip-flop, and mapping a second gated clock to the second clocked D-type master-slave flip-flop;

implementing the mapped circuit on the clocked synchronous device to perform functions mapped from the asynchronous circuit;

operating the clocked synchronous device; and using a result of operating the clocked synchronous device to verify the design of the asynchronous circuit.

2. The method of claim 1, further comprising:

passing the first gated clock to the first clocked D-type master-slave flip-flop when the first clocked D-type master-slave flip-flop is set to empty and a first input signal indicates that incoming data are valid;

passing the first gated clock to the first clocked D-type master-slave flip-flop when the first clocked D-type master-slave flip-flop is set to full and a second input signal indicates that a next synchronous cell is empty; and passing the second gated clock to the second clocked D-type master-slave flip-flop when the first clocked D-type master-slave flip-flop is set to empty and the first input signal indicates that the incoming data are valid.

3. The method of claim 1, wherein mapping the asynchronous cell includes:

mapping the SR flip-flop in the control path of the asynchronous cell to a data recirculation cell in the synchronous cell, wherein the data recirculation cell includes the first clocked D-type master-slave flip-flop used as a data recirculation flip-flop;

mapping the pass-gate and the sticky-buffer in the data path of the asynchronous cell to the data recirculation flip-flop in the synchronous cell, wherein the data recirculation cell indicates that the data recirculation flip-flop is one of empty and full;

mapping a first recirculation control signal to the data recirculation cell; and mapping a second recirculation control signal to the data recirculation flip-flop.

4. The method of claim 3, further comprising:

setting the first recirculation control signal to change a state of the data recirculation cell when the data recirculation cell is set to empty and a first input signal indicates that incoming data are valid;

setting the first recirculation control signal to change the state of the data recirculation cell when the data recirculation cell is set to full and a second input signal indicates that a next synchronous cell is empty; and setting the second recirculation control signal to allow an incoming data value to set the state of the data recirculation flip-flop.

5. A computer-readable storage medium storing instructions that when executed by a computer cause the computer to perform a method for prototyping an asynchronous circuit, the method comprising:

receiving a design of the asynchronous circuit, the design including asynchronous cells;

mapping an asynchronous cell of the asynchronous circuit onto a synchronous cell within a clocked synchronous device thereby creating a mapped circuit, wherein the synchronous cell simulates an operation of the asynchronous cell and wherein mapping the asynchronous cell involves:

mapping an SR flip-flop in a control path of the asynchronous cell to a first clocked D-type master-slave flip-flop in the synchronous cell, mapping a pass-gate and a sticky-buffer in a data path of the asynchronous cell to a second clocked D-type master-slave flip-flop in the synchronous cell, wherein the first clocked D-type master-slave flip-flop indicates that the second clocked D-type master-slave flip-flop is one of empty and full, mapping a first gated clock to the first clocked D-type master-slave flip-flop, and mapping a second gated clock to the second clocked D-type master-slave flip-flop;

implementing the mapped circuit on the clocked synchronous device to perform functions mapped from the asynchronous circuit;

operating the clocked synchronous device; and using a result of operating the clocked synchronous device to verify the design of the asynchronous circuit.

6. The computer-readable storage medium of claim 5, the method further comprising:

passing the first gated clock to the first clocked D-type master-slave flip-flop when the first clocked D-type master-slave flip-flop is set to empty and a first input signal indicates that incoming data are valid;

passing the first gated clock to the first clocked D-type master-slave flip-flop when the first clocked D-type master-slave flip-flop is set to full and a second input signal indicates that a next synchronous cell is empty; and passing the second gated clock to the second clocked D-type master-slave flip-flop when the first clocked D-type master-slave flip-flop is set to empty and the first input signal indicates that the incoming data are valid.

7. The computer-readable storage medium of claim 5, wherein mapping the asynchronous cell includes:

mapping the SR flip-flop in the control path of the asynchronous cell to a data recirculation cell in the synchronous cell, wherein the data recirculation cell includes the first clocked D-type master-slave flip-flop used as a data recirculation flip-flop;

mapping the pass-gate and the sticky-buffer in the data path of the asynchronous cell to the data recirculation flip-flop in the synchronous cell, wherein the data recirculation cell indicates that the data recirculation flip-flop is one of empty and full;

mapping a first recirculation control signal to the data recirculation cell; and mapping a second recirculation control signal to the data recirculation flip-flop.

8. The computer-readable storage medium of claim 7, the method further comprising:

setting the first recirculation control signal to change a state of the data recirculation cell when the data recirculation cell is set to empty and a first input signal indicates that incoming data are valid;

setting the first recirculation control signal to change the state of the data recirculation cell when the data recirculation cell is set to full and a second input signal indicates that a next synchronous cell is empty; and setting the second recirculation control signal to allow an incoming data value to set the state of the data recirculation flip-flop.

9. A method for prototyping an asynchronous circuit, comprising:

receiving a design of the asynchronous circuit, the design including asynchronous cells;

mapping the asynchronous circuit onto a globally clocked programmable synchronous device, wherein the globally clocked programmable synchronous device simulates an operation of the asynchronous circuit wherein the globally clocked programmable synchronous device includes a field-programmable gate-array that is mapped using a system supplied by a manufacturer of the field-programmable gate-array;

programming the globally clocked programmable synchronous device to perform functions mapped from the asynchronous circuit;

operating the globally clocked programmable synchronous device; and using a result of operating the globally clocked programmable synchronous device to verify the design of the asynchronous circuit.

10. A method for prototyping an asynchronous circuit, comprising:

receiving a design of the asynchronous circuit, the design including asynchronous cells;

mapping an asynchronous cell of the asynchronous circuit onto a synchronous cell within a clocked synchronous device thereby creating a mapped circuit, wherein the clocked synchronous device is one of a field-programmable gate array and a standard cell gate array, and wherein the synchronous cell simulates an operation of the asynchronous cell;

implementing the mapped circuit on the clocked synchronous device to perform functions mapped from the asynchronous circuit;

operating the clocked synchronous device; and using a result of operating the clocked synchronous device to verify the design of the asynchronous circuit.

11. A method for prototyping an asynchronous circuit, comprising:

receiving a design of the asynchronous circuit, the design including asynchronous cells;

mapping an asynchronous cell of the asynchronous circuit onto a synchronous cell within a clocked synchronous device thereby creating a mapped circuit, wherein the synchronous cell simulates an operation of the asynchronous cell and wherein mapping the asynchronous cell involves:

mapping an SR flip-flop in a control path of the asynchronous cell to a first data recirculation flip-flop in the synchronous cell, mapping a pass-gate and a sticky-buffer in a data path of the asynchronous cell to a second data recirculation flip-flop in the synchronous cell, wherein the first data recirculation flip-flop indicates that the second data recirculation flip-flop is one of empty and full, mapping a first recirculation control signal to the first data recirculation flip-flop, and mapping a second recirculation control signal to the second data recirculation flip-flop;

implementing the mapped circuit on the clocked synchronous device to perform functions mapped from the asynchronous circuit;

operating the clocked synchronous device; and using a result of operating the clocked synchronous device to verify the design of the asynchronous circuit.

12. The method of claim 11, further comprising:

setting the first recirculation control signal to change a state of the first data recirculation flip-flop when the first data recirculation flip-flop is set to empty and a first input signal indicates that incoming data are valid;

setting the first recirculation control signal to change the state of the first data recirculation flip-flop when the first data recirculation flip-flop is set to full and a second input signal indicates that a next synchronous cell is empty; and setting the second recirculation control signal to allow an incoming data value to set the state of the second data recirculation flip-flop when the first data recirculation flip-flop is set to empty and the first input signal indicates that the incoming data are valid.

13. A computer-readable storage medium storing instructions that when executed by a computer cause the computer to perform a method for prototyping an asynchronous circuit, the method comprising:

receiving a design of the asynchronous circuit, the design including asynchronous cells;

mapping an asynchronous cell of the asynchronous circuit onto a synchronous cell within a clocked synchronous device thereby creating a mapped circuit, wherein the synchronous cell simulates an operation of the asynchronous cell and wherein mapping the asynchronous cell involves:

mapping an SR flip-flop in a control path of the asynchronous cell to a first data recirculation flip-flop in the synchronous cell, mapping a pass-gate and a sticky-buffer in a data path of the asynchronous cell to a second data recirculation flip-flop in the synchronous cell, wherein the first data recirculation flip-flop indicates that the second data recirculation flip-flop is one of empty and full, mapping a first recirculation control signal to the first data recirculation flip-flop, and mapping a second recirculation control signal to the second data recirculation flip-flop;

implementing the mapped circuit on the clocked synchronous device to perform functions mapped from the asynchronous circuit;

operating the clocked synchronous device; and using a result of operating the clocked synchronous device to verify the design of the asynchronous circuit.

14. A computer-readable storage medium storing instructions that when executed by a computer cause the computer to perform a method for prototyping an asynchronous circuit, the method comprising:

receiving a design of the asynchronous circuit, the design including asynchronous cells;

mapping an asynchronous cell of the asynchronous circuit onto a synchronous cell within a clocked synchronous device thereby creating a mapped circuit, wherein the synchronous cell simulates an operation of the asynchronous cell and wherein mapping the asynchronous cell involves:

mapping an SR flip-flop in a control path of the asynchronous cell to a first data recirculation flip-flop in the synchronous cell, mapping a pass-gate and a sticky-buffer in a data path of the asynchronous cell to a second data recirculation flip-flop in the synchronous cell, wherein the first data recirculation flip-flop indicates that the second data recirculation flip-flop is one of empty and full, mapping a first recirculation control signal to the first data recirculation flip-flop, and mapping a second recirculation control signal to the second data recirculation flip-flop;

implementing the mapped circuit on the clocked synchronous device to perform functions mapped from the asynchronous circuit;

operating the clocked synchronous device; and using a result of operating the clocked synchronous device to verify the design of the asynchronous circuit.

15. The computer-readable storage medium of claim 14, the method further comprising:

setting the first recirculation control signal to change a state of the first data recirculation flip-flop when the first data recirculation flip-flop is set to empty and a first input signal indicates that incoming data are valid;

setting the first recirculation control signal to change the state of the first data recirculation flip-flop when the first data recirculation flip-flop is set to full and a second input signal indicates that a next synchronous cell is empty; and setting the second recirculation control signal to allow an incoming data value to set the state of the second data recirculation flip-flop when the first data recirculation flip-flop is set to empty and the first input signal indicates that the incoming data are valid.

16. A method for prototyping an asynchronous circuit, comprising:

receiving a design of the asynchronous circuit, the design including asynchronous cells;

mapping the asynchronous circuit onto a globally clocked programmable synchronous device, wherein the globally clocked programmable synchronous device simulates an operation of the asynchronous circuit and wherein the globally clocked programmable synchronous device is a cell within a standard cell library that is mapped using a system supplied by a supplier of the standard cell library;

programming the globally clocked programmable synchronous device to perform functions mapped from the asynchronous circuit;

operating the globally clocked programmable synchronous device; and using a result of operating the globally clocked programmable synchronous device to verify the design of the asynchronous circuit.

* * * * *